United States Patent [19]

Curran et al.

[11] 4,197,509

[45] Apr. 8, 1980

[54] VARIABLE SEGMENTED RAMP VOLTAGE SYNTHESIZER

[75] Inventors: William J. Curran, Orlando; John J. Kulik, Longwood, both of Fla.

[73] Assignee: The United States of America as represented by the Secretary of the Navy, Washington, D.C.

[21] Appl. No.: 932,838

[22] Filed: Aug. 11, 1978

[51] Int. Cl.² .................... H03K 3/86; G06G 7/12
[52] U.S. Cl. ........................... 328/67; 307/229; 328/183
[58] Field of Search ............... 307/229; 328/183, 184, 328/67

[56] References Cited

U.S. PATENT DOCUMENTS

| 2,831,107 | 4/1958 | Raymond et al. | 307/229 |
| 3,031,583 | 4/1962 | Murphy | 328/183 |

Primary Examiner—Harold A. Dixon
Attorney, Agent, or Firm—Richard S. Sciascia; Robert W. Adams

[57] ABSTRACT

A variable segmented ramp voltage synthesizer is disclosed as including a master pulse generator and a plurality of series connected one-shot multivibrators connected to the output thereof for producing a like plurality of gating signals. In response to said gating signals, a like plurality of successively increasing voltages, effected by a given positive direct current voltage source and appropriately different resistances, are gated into a constant current generator. The output signal from said constant current generator is substantially stair-step in waveform, and it is supplied to a predetermined, relatively large capacitance for the charging thereof with respect to another direct current voltage that is more negative than the aforementioned positive direct current voltage. The charging thereof occurs as serially connected substantially linear segments, the ramp-like slopes of which are proportional to the RC time constants effected by the aforesaid resistances in successive combinations with said capacitance, respectively. An electronic switch timely discharges said capacitance in response to the master timing pulses produced by said master pulse generator, so as to produce flyback in preparation for synthesizing another sawtooth signal cycle. A circuit isolation buffer amplifier is optionally connected to the effective output of the aforesaid capacitance.

25 Claims, 2 Drawing Figures

VARIABLE SEGMENTED RAMP VOLTAGE SYNTHESIZER

BACKGROUND OF THE INVENTION

The present invention relates, in general, to signal generators and, in particular, pertains to a sawtooth signal generator. In even greater particularity, the subject invention consists of an electronic synthesizer that produces a variable segmented substantially linear ramp signal that may be used as a continuous driving force on an electron beam in a cathode ray tube or a television camera tube, thereby permitting control of the positions of the picture elements on the faces thereof, as desired.

DESCRIPTION OF THE PRIOR ART

Heretofore, numerous sawtooth sweep generators have been employed to produced electrical signals having sawtooth waveforms of various and sundry shapes. As a general rule, such sawtooth signals are continuous in nature and are generally designed to have some predetermined linear or non-linear ramp slope.

In addition to the prior art mentioned above, the High Resolution Low Distortion Television System of U.S. Pat. No. 3,542,951, by Hanns H. Wolff, discloses dual sets of line deflection voltage generators and field sweep voltage generators for a camera and a picture tube in a televison system, together with means for alternately switching the line and field sync pulse inputs between the line and field sweep generators of said dual sets of sweep voltage generators after each frame. Also included is an adjustable correction voltage generator for each line and field sweep voltage generator which may be set so that the voltage or current furnished to the camera and cathode ray tube deflection systems is of the exact waveshape necessary to cause the electron beams of the camera and picture tube to scan at the exact rate and in the exact path necessary to secure a distortion-free picture.

Of the two aforementioned sawtooth signal type sweep generators, the former is almost too numerous to discuss, and the latter, although pertinent as prior art, is ostensively much more complex than the instant invention. Nevertheless, for their respective intended purposes, they undoubtedly work quite well and, thus, contribute to the state of the art. Of course, the former have been useful in oscilloscopes, conventional television systems, and other devices incorporating electronic scanning elements, such as cathode ray tubes and the like; and the latter have been useful in more sophisticated television systems and other image generation systems, such as, for instance, those of the type employed in conjunction with training simulators and entertainment systems, wherein certain substantially real life or other image situations are improvised and provided as optical stimulants to a particular trainee or observer.

SUMMARY OF THE INVENTION

The present invention overcomes some of the disadvantages of the known prior art, including that mentioned above, in that it is more versatile than the conventional sawtooth generators, and it is relatively simple of structure when compared with the device of U.S. Pat. No. 3,542,951 to Wolff. Furthermore, it permits the synthesizing of a segmented ramp voltage, the segments of which may be slope-controlled in such manner as to effect many possible combinations and permutations thereof. Therefore, considerable latitude, as far as overall ramp configurations are concerned, is obtainable.

The aforementioned versatility is made possible because the subject invention is accurately timed by a master oscillator, with the output pulses thereof employed to timely enable a multi-stage digital switching subsystem comprising a plurality of one-shot multivibrators and control gates. The outputs of the respective one-shot multivibrators key a series of control gates, which, in turn, timely supply currents (predetermined by a positive direct current voltage) via adjustable resistors to a constant current generator. The latter, of course, produces a constant current at the output thereof, regardless of the variation of the load thereon. Said one-shot multivibrators are series connected, so as to be successively activated. The output current from the constant current generator causes a capacitance to be successively charged as substantially linear ramp voltage segments, the duration of which is controlled by the period settings of the aforesaid one-shot multivibrators, respectively. After the last ramp voltage segment has been generated, said master oscillator keys the closing of an electronic switch connected in parallel with said capacitance, so as to initiate flyback as a result of the discharging thereof and, thus, prepare the entire system for generating the next ramp or sawtooth signal. A buffer amplifier isolates the subject system from whatever load is connected to the output thereof.

As may readily be seen from the foregoing, the present invention is exceedingly simple of structure and very easily operated; however, in spite of its simplicity, it produces a segmented ramp voltage which may have its segmented slopes and periods adjusted to facilitate the optimizing thereof for almost any intended purpose, including the directing of the scanning of projectors being used to project large field-of-view scenes on viewing screens.

Therefore, an object of paramount importance of the invention is to provide an improved sawtooth signal generator.

Another object of this invention is to provide a method and means for producing substantially linear segmented ramp sawtooth voltage signals, the ramp segments of which may be varied as desired, both in slope and period.

Still another object of the invention is to provide an improved method and means for driving an electron beam in a cathode ray tube, television camera, or optical image projector in such manner as to control the position of the picture elements on the faces thereof.

A further object of this invention is to provide a method and means for selectively improving the image fidelity of a picture generated by a television system.

Another object of this invention is to provide an improved, rapid-acting, highly-accurate, easily-adjusted synthesizer of various and sundry voltage and current signals.

Another object of this invention is to provide a reliable signal synthesizer that is easily and economically constructed, operated, maintained, and installed.

Other objects, advantages and novel features of the invention will become apparent from the following detailed description of the invention when considered in conjunction with the accompanying drawing wherein:

DESCRIPTION OF THE PREFERRED EMBODIMENT

Figure 1:
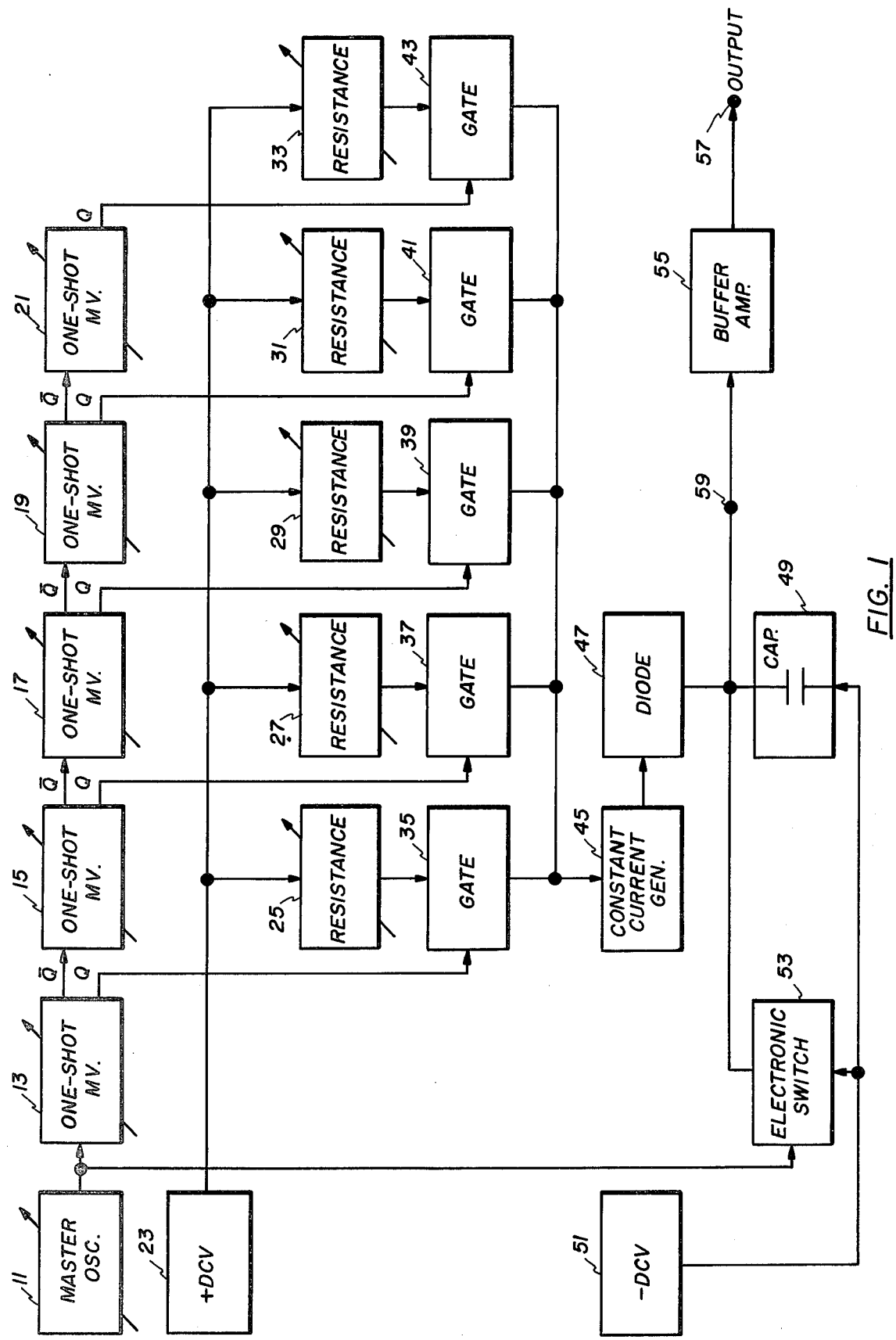
FIG. 1 is a combination block and schematic diagram of the variable segmented ramp synthesizer constituting the subject invention.

Referring now to FIG. 1, the invention is shown as comprising an adjustable master oscillator 11, which may be operated at any frequency that is appropriate for the invention's intended use. Nevertheless, for most television purposes and for most multiple projection purposes, it has been determined that the preferred operational frequencies therefor are 33 Hz and 120 Hz, respectively.

The output of master oscillator 11 is connected to the trigger input of an adjustable period one-shot multivibrator 13, the $\overline{Q}$ output of which is connected to the trigger input of another adjustable period one-shot multivibrator 15, the $\overline{Q}$ output of which is connected to the trigger input of still another adjustable period one-shot multivibrator 17. The $\overline{Q}$ output of one-shot multivibrator 17 is connected to the trigger input of an adjustable period multivibrator 19, and the $\overline{Q}$ output of one-shot multivibrator 19 is connected to the trigger input of another adjustable period one-shot multivibrator 21.

From the foregoing, it may readily be seen that the aforementioned one-shot multivibrators 13, 15, 17, 19, and 21 are effectively series connected and only five in number. Nevertheless, it should be understood that any number thereof may be employed that will optimize the invention for any given operational situation. Accordingly, they may be two in number or two hundred in number, if so desired. Of course, it would be well within the purview of the artisan having the benefit of the teachings presented herewith to select whatever number of one-shot multivibrators as would suit the occasion, since so doing would merely involve the making of design choices.

A positive direct current voltage (+DCV) source is connected to one of the input terminals of each of a plurality of adjustable resistances 25, 27, 29, 31, and 33, the number of which, in this particular case, is obviously five, like the aforementioned plurality of one-shot multivibrators. The output terminals of the aforesaid adjustable resistances 25, 27, 29, 31, and 33 are respectively connected to the data inputs of a like number of control gates 35, 37, 39, 41, and 43; and the control inputs of said gates 35, 37, 39, 41, and 43 are respectively connected to the Q outputs of the aforementioned adjustable one-shot multivibrators 13, 15, 17, 19, and 21.

The outputs of gates 35, 37, 39, 41, and 43 are interconnected and connected to the input of a constant current generator 45, the latter of which is conventional and commercially available.

As suggested above, any suitable conventional constant current generator may be used for that referenced as constant current generator 45; on the other hand, if preferred by the artisan, an NPN transistor NO. 2N222, manufactured and sold by the Fairchild Camera and Instrument Company of Palo Alto, California, may be used therefor, inasmuch as it has been determined that it is quite satisfactory for such purpose.

A circuit isolation diode 47 is optionally connected between the output of said constant current generator 45 and one plate of a capacitance 49, so as to prevent the latter's discharge back through the former after each and every charging segment of said capacitance 49, as will be discussed more fully subsequently during the explanation of the operation of the invention. And a predetermined negative direct current voltage source 51 (or ground, if so desired) is connected to the other plate of capacitance 49. An electrically actuated normally open switch 53 is connected in parallel with capacitance 49, with the electrical actuation or control input thereof being connected to the output of the aforesaid master oscillator 11.

A buffer amplifier 55 preferably has its input connected to the junction of the output of diode 47 (or of constant current generator 45, if the invention does not include diode 47 in accordance with the design choice of the artisan) and said one plate of capacitance 49, and the output of buffer amplifier 55 is connected to an output terminal 57, which, of course, constitutes at least one of the possible outputs of the invention.

Another possible output of the invention may be located at one of two other places, namely: (1) at a terminal 59 connected to the output of constant current generator 45, if diode 47 and buffer amplifier 55 are not incorporated in the invention; and (2) at the output of diode 47, if it is incorporated in the invention but buffer amplifier 55 is not. Of course, in any case, either buffer amplifier 55 or output terminal 59 are effectively connected to the output of capacitance 49, since the input-output plate thereof is either connected to the output of diode 47 or the output of constant current generator 45, depending upon the design choice of the artisan constructing and using the invention.

At this time, it may be noteworthy that all of the components included in the system of FIG. 1 are well known, conventional, and commercially available; hence, it should be understood that it is their new and unique interconnections and interactions which cause the instant invention to be effected and which, in turn, cause the above indicated new and improved results to be produced thereby.

MODE OF OPERATION

Figure 2:
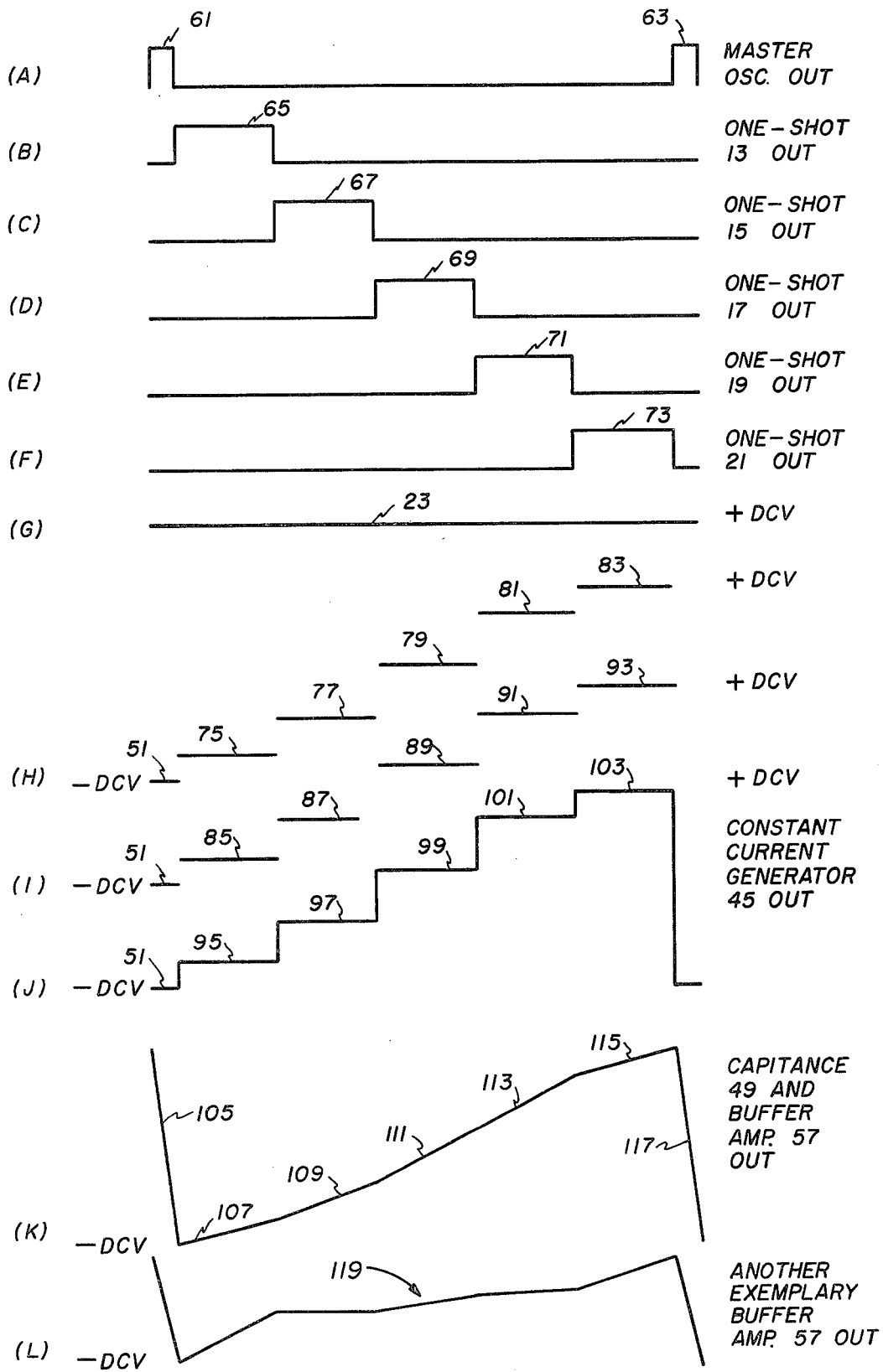
FIG. 2 depicts idealized representations of the various signal waveforms which emanate from the components of the system of FIG. 1, respectively.

The operation of the invention will now be discussed briefly in conjunction with both FIGS. 1 and 2 of the drawing.

Master oscillator 11 produces a signal at the output thereof which is similar to that ideally portrayed in FIG. 2(A), in that it generates a succession of pulses 61, 63, etc., in accordance with the particular frequency preset therein. In response to the first pulse—that is, pulse 61, in this instance—one-shot multivibrator 13 is triggered, which, in turn, produces a pulse 65 similar to that illustrated in FIG. 2(B) at the $\overline{Q}$ output thereof. Then, because one-shot multivibrators 15, 17, 19, and 21 are connected in series with each other and the aforesaid one-shot multivibrator 13, they respectively produce pulses 65, 67, 69, 71, and 73 of FIG. 2(C), (D), (E), and (F).

At this time, it would perhaps be worthy of reiterating the fact that the preset periods of all of the aforesaid one-shot multivibrators may be varied as warranted by operational circumstances, in which case pulses 65, 67, 69, 71, and 73 would be varied in duration or length, rather than being substantially equal in duration, as they are depicted in FIG. 2(B) through (F). Such possible preset variations, of course, lend considerable variation to the shape of the output signal from the invention, thereby increasing its utility, inasmuch as any or all of the ramp voltage segments may be adjusted, as desired.

As portrayed in FIG. 2(G), any positive direct current voltage (+DCV) may be supplied by +DCV 23, and that is the voltage that is applied to resistances 25 through 33 for the respective dropping thereof in accordance with the slopes desired for the successive ramp segments. For example, let it be assumed that such voltage drops are successively decreased between resistances 25 through 33. Then, voltages 75, 77, 79, 81, and 83 of FIG. 2(H) would be the output voltages from resistances 25, 27, 29, 31, and 33, respectively; and then, these same voltages depicted as voltages 85, 87, 89, 91, and 93 in FIG. 2(I) would be the output voltages from gates 35, 37, 39, 41, and 43, respectively, when they are successively and timely opened in accordance with the aforementioned respective pulses 65, 67, 69, 71, and 73 of FIG. 2(B), (C), (D), (E), and (F).

As seen in FIG. 2(J), the output signal of constant current generator 45 has a sort of stairstep waveform, the steps 95, 97, 99, 101, and 103 of which are successive, additive, and of such respective heights as are provided by the aforesaid voltages 85, 87, 89, 91, and 93.

The aforementioned constant current generator 45 is one of the key components of this invention because it does at least three things that vastly improve the operation thereof, viz.:

1. It produces a constant current output signal, regardless of the electrical load connected thereto;
2. It causes the ramp voltage of each segment to be linear, thereby, in turn, causing the slope of each individual segment included within any number of segments occurring within any desired sawtooth signal to be linear, too, regardless of the slopes of its adjacent neighboring segments; and
3. The combination of operations 1 and 2 above permit the subject invention to be used to an advantage as the sweep generators for both horizontal and vertical rasters in cathode ray or other electron gun tubes, since the improved relative linearities thereof permit the production of pictures having vastly improved fidelity throughout the entire face thereof.

The time period between the trailing edge of master oscillator pulse 61 and the leading edge of master oscillator leading edge pulse 63 constitutes the period of the total sawtooth ramp generating portion of each cycle, with the time period between the leading and trailing edges of each master oscillator pulse constituting the flyback time. Thus, as best seen in FIG. 2(K), flyback 105 is initiated by the leading edge of pulse 61, since the beginning of pulse 61 also effects the closure of electronic switch 53 which, in turn, causes capacitance 49 to discharge from its highest ramp voltage of the immediately preceding cycle. Then, electronic switch 53 is timely opened by the occurrence of the trailing edge of pulse 61, which also causes gates 35, 37, 39, 41, and 43 to be timely and successively opened. Hence, capacitance 49 begins to charge and charges in time intervals as successive segments 107, 109, 111, 113, and 115, the slopes of which are substantially determined by the RC time constants of resistance 25 and capacitance 49, resistance 27 and capacitance 49, resistance 29 and capacitance 49, resistance 31 and capacitance 49, and resistance 33 and capacitance 49, respectively. Of course, as previously suggested, the respective durations and slopes of said ramp segments is contingent upon the preset periods of the aforesaid adjustable one-shot multivibrators 13, 15, 17, 19, and 21 and the respective resistances preset into the aforementioned adjustable resistances 25, 27, 29, 31, and 33. Upon the occurrence of the leading edge of master oscillator pulse 63, switch 53 is again closed, thereby causing capacitance 49 to rapidly discharge and flyback 117 to occur for that period of time equal to the time period of pulse 63.

The output of the entire invention may be considered as being at the junction of the output of diode 47 and the aforesaid one plate of capacitance 49 which is connected to output terminal 55, or it may be considered as being at the output of buffer amplifier 57 or at output terminal 59 connected thereto, as desired, inasmuch as buffer amplifier 57 merely acts as a circuit isolation and amplification circuit.

From the foregoing, it may readily be seen that each preceding sawtooth signal cycle initiates the occurrence of its successive sawtooth cycle without interruption, and that sawtooth signal production is, therefore, continuous until the invention is turned off.

The sawtooth signal of FIG. 2(K) is representative of that which is produced by the signal waveforms of FIG. 2(A) through FIG. 2(J); however, by now it should be readily appreciated that the geometrical configuration may be varied considerably merely by making the desired adjustments for the aforementioned one-shot multivibrator and resistances, and by appropriately selecting the capacitance of the aforesaid capacitance 49. Accordingly, the exemplary sawtooth signal of FIG. 2(L) has been employed to illustrate another design possibility. From it and the sawtooth signal of FIG. 2(K), it should readily be discerned that the segment period and slope combinations capable of being synthesized by the invention are considerable, indeed; and, therefore, the subject invention has many applications, including those mentioned above.

Obviously, many modifications and variations of the present invention are possible in light of the above teachings. It is, therefore, to be understood that within the scope of the appended claims the invention may be practiced otherwise than as specifically described.

What is claimed is:

1. A variable segmented ramp voltage synthesizer, comprising in combination:
   means for producing a series of first pulses of predetermined period and frequency;
   means connected to the output of said series of first pulses producing means for timely producing a successive plurality of second pulses having predetermined periods, respectively;
   means for supplying a positive direct current voltage;
   means connected to the output of said positive direct current voltage supplying means for producing a plurality of successively increasing voltages;
   a constant current generator means;
   means connected to predetermined outputs of the aforesaid second pulses producing means, the outputs of said plurality of successively increasing voltages producing means, and the input of said constant current generator means for the timely gating of said plurality of successively increasing voltages to said constant generator means;
   means for supplying a predetermined negative direct current voltage;
   a capacitance means effectively connected between the output of said constant current generator means and the aforesaid predetermined negative direct current voltage supplying means; and a normally open switch having a control input and a pair of outputs, with the control input thereof connected to the output of the aforesaid first pulses producing means, and with the outputs thereof connected across said capacitance.

2. The device of claim 1, wherein said means for producing a series of first pulses of predetermined period and frequency comprises an adjustable frequency master oscillator.

3. The device of claim 1, wherein said means connected to the output of said series of first pulses producing means for timely producing a successive plurality of second pulses having predetermined periods, respectively, comprises a like plurality of series-connected adjustable one-shot multivibrators.

4. The device of claim 1, wherein said means connected to the output of said positive direct current voltage supplying means for producing a plurality of voltages comprises a plurality of adjustable resistances, each of which has a data input and an output, with the data inputs thereof interconnected and connected to the aforesaid positive direct current voltage supplying means.

5. The device of claim 1, wherein said means connected to predetermined outputs of the aforesaid second pulses producing means, the outputs of said plurality of increasing voltage producing means, and the input of said constant current generator means for the timely gating of said plurality of successively increasing voltages to said constant current generator means comprises a plurality of control gates, each of which has a data input, a control input, and an output, with the data inputs thereof respectively connected to the outputs of said plurality of increasing voltage producing means, and with the control inputs thereof connected to respective outputs of the aforesaid second pulses producing means.

6. The invention of claim 1, further characterized by means connected between the output of said constant current generator means and the input of said capacitance means for timely preventing the discharge of said capacitance means back to said constant current generating means during the discharge thereof.

7. The invention of claim 1, further characterized by an output terminal effectively connected to the output of capacitance means.

8. The invention of claim 1, further characterized by a buffer amplifier connected to the output of said capacitance means.

9. The device of claim 1, wherein said constant current generator means comprises an NPN transistor.

10. A variable segmented sawtooth voltage signal synthesizer, comprising in combination:
    an adjustable master oscillator for producing a master pulse signal having a predetermined pulse frequency at the output thereof;
    a first direct current voltage source;
    a second direct current voltage source, the voltage of which is more positive than the voltage from said first direct current voltage source;
    means connected to the output of said adjustable oscillator for serially producing a plurality of pulses, the periods of which may be adjusted in such manner as to make each one thereof have any predetermined duration;
    a capacitor having a pair of plates, with one of the plates thereof connected to the output of said first direct current voltage source;
    means connected to the outputs of said plurality of serial pulses producing means, the output of said second direct current voltage source, and the other plate of said capacitor for timely charging said capacitor for a predetermined plurality of consecutive segmented periods in response to the aforesaid plurality of serial pulses; and
    means connected between the aforesaid adjustable master oscillator and said capacitor for timely effecting the discharge thereof between adjacent ones of the aforesaid plurality of consecutive segmented capacitor charging periods.

11. The device of claim 10, wherein said first direct current voltage source is a negative direct current voltage source.

12. The device of claim 10, wherein said second direct current voltage source, the voltage of which is more positive than the voltage from said first direct current voltage source, is a positive direct current voltage source.

13. The device of claim 10, wherein said means connected to the output of said adjustable oscillator for serially producing a plurality of pulses, the periods of which may be adjusted in such manner as to make each one thereof have a predetermined duration, comprises:
    a first adjustable one-shot multivibrator having a trigger input, a $\overline{Q}$ input, and a Q output; and
    a second adjustable one-shot multivibrator having a trigger input, a $\overline{Q}$ output, and a Q output, with the trigger input thereof connected to the $\overline{Q}$ output of said first adjustable one-shot multivibrator.

14. The device of claim 10, wherein said means connected to the outputs of said plurality of serial pulses producing means, the output of said second direct current voltage source, and the other plate of said capacitor for timely charging said capacitor for a predetermined plurality of consecutively segmented periods in response to the aforesaid plurality of serial pulses, comprises:
    a pair of adjustable resistances, each of which has a data input and an output, with the data inputs thereof interconnected and connected to the output of said second direct current voltage source;
    a pair of control gates, each of which has a data input, a control input, and an output, with the data inputs thereof respectively connected to the outputs of said pair of adjustable resistances, and with the control inputs thereof connected to respective outputs of said plurality of serial pulses producing means for respective response to the serial pulses produced thereby; and
    a constant current generator connected between the outputs of said pair of control gates and said other plate of said capacitor.

15. The device of claim 10, wherein said means connected to the outputs of said plurality of serial pulses producing means, the output of said second direct current voltage source, and the other plate of said capacitor for timely charging said capacitor for a predetermined plurality of consecutively segmented periods in response to the aforesaid plurality of serial pulses, comprises:
    a pair of adjustable resistances, each of which has a data input and an output, with the data inputs thereof interconnected and connected to the output of said second direct current voltage source;

a pair of control gates, each of which has a data input, a control input, and an output, with the data inputs thereof respectively connected to the outputs of said pair of adjustable resistances, and with the control inputs thereof connected to respective outputs of said plurality of serial pulses producing means for respective response to the serial pulses produced thereby;

a constant current generator connected to the outputs of said pair of control gates; and a diode connected between the output of said constant current generator and the other plate of the aforesaid capacitor.

16. The device of claim 10, wherein said means connected between the aforesaid adjustable master oscillator and said capacitor for timely effecting the discharge thereof between adjacent ones of the aforesaid plurality of consecutive segmented capacitor charging periods, comprises an electronic switch having a control input and a pair of outputs, with the control input thereof connected to the output of said adjustable master oscillator, and with the outputs thereof connected in parallel with said capacitor.

17. The device of claim 10, further characterized by a buffer amplifier connected to the output of said capacitor.

18. A variable linearly-segmented sawtooth voltage signal synthesizer, comprising in combination:

an adjustable frequency master oscillator;

a first adjustable one-shot multivibrator having a trigger input, a $\bar{Q}$ output, and a Q output, with the trigger input thereof connected to the output of said adjustable master oscillator;

a second adjustable one-shot multivibrator having a trigger input, a $\bar{Q}$ output, and a Q output, with the trigger input thereof connected to the $\bar{Q}$ output of said first adjustable one-shot multivibrator;

a third adjustable one-shot multivibrator having a trigger input, a $\bar{Q}$ output, and a Q output, with the trigger input thereof connected to the $\bar{Q}$ output of said second adjustable one-shot multivibrator;

a fourth adjustable one-shot multivibrator having a trigger input, a $\bar{Q}$ output, and a Q output, with the trigger input thereof connected to the $\bar{Q}$ output of said third adjustable one-shot multivibrator;

a fifth adjustable one-shot multivibrator having a trigger input and a Q output, with the trigger input thereof connected to the $\bar{Q}$ output of the aforesaid fourth one-shot multivibrator;

a first predetermined direct current voltage source;

a second predetermined direct current voltage source, the voltage of which is less than the voltage produced by the aforesaid first predetermined direct current voltage source;

five adjustable resistances, each one of which has an input and an output, the inputs of which are interconnected and connected to the output of said first predetermined direct current voltage source;

five control gates, each one of which has a data input, a control input, and an output, with the data inputs thereof respectively connected to the output of said five adjustable resistances, and with the control inputs thereof respectively connected to the Q outputs of the aforesaid first, second, third, fourth, and fifth adjustable one-shot multivibrators;

a constant current generator having an input and an output, with the input thereof connected to the outputs of said five control gates;

a predetermined capacitance having a pair of plates, with one of the plates thereof effectively connected to the output of said constant current generator, and with the other plate thereof connected to the output of the aforesaid second predetermined direct current voltage source;

a normally open electronic switch having a control input, and a pair of outputs, with the control input thereof connected to the output of the aforesaid adjustable master oscillator, and with the outputs thereof respectively connected to the pair of plates of said capacitance; and an output terminal connected to said one plate of the aforesaid capacitance.

19. The device of claim 18, wherein said first predetermined direct current voltage source is a positive direct current voltage source.

20. The device of claim 18, wherein said second predetermined direct current voltage source is a negative direct current voltage source.

21. The device of claim 18, wherein said five adjustable resistances decrease in resistance as they are consecutively counted from one through five.

22. The invention of claim 18, wherein said constant current generator comprises an NPN transistor.

23. The invention of claim 18, further characterized by a diode connected between the output of said constant current generator and said one plate of the aforesaid capacitance.

24. The invention according to claim 18, further characterized by a buffer amplifier connected to said one plate of the aforesaid capacitance.

25. The invention of claim 24, further characterized by an output terminal connected to the output of said buffer amplifier.

* * * * *